United States Patent
Spady et al.

(10) Patent No.: US 6,779,278 B1
(45) Date of Patent: Aug. 24, 2004

(54) COMPACT ROTATING STAGE

(75) Inventors: Blaine R. Spady, Lincoln, NE (US); Dan M. Colban, Tracy, CA (US)

(73) Assignee: Nanometrics Incorporated, Milpitas, CA (US)

(*) Notice: Subject to any disclaimer, the term of this patent is extended or adjusted under 35 U.S.C. 154(b) by 0 days.

(21) Appl. No.: 10/622,385

(22) Filed: Jul. 17, 2003

(51) Int. Cl.[7] .............................................. B65G 49/07
(52) U.S. Cl. ........................................ 33/569; 414/936
(58) Field of Search .................. 33/568, 569; 414/774, 414/935, 936; 269/71

(56) References Cited

U.S. PATENT DOCUMENTS

| | | | | |
|---|---|---|---|---|
| 4,717,309 A | * | 1/1988 | Neuhaus ....................... | 269/71 |
| 4,770,600 A | * | 9/1988 | Ishikawa ..................... | 414/936 |
| 4,896,869 A | * | 1/1990 | Takekoshi .................... | 269/71 |
| 5,052,884 A | * | 10/1991 | Igari .......................... | 414/935 |
| 5,054,991 A | * | 10/1991 | Kato .......................... | 414/936 |
| 5,848,868 A | * | 12/1998 | Suzuki et al. ................ | 414/936 |
| 6,231,716 B1 | * | 5/2001 | White et al. ................. | 414/935 |
| 6,340,281 B1 | * | 1/2002 | Haraguchi et al. .......... | 414/936 |
| 6,434,840 B1 | * | 8/2002 | Jourtchenko et al. ......... | 33/568 |
| 6,438,449 B2 | | 8/2002 | Kawamatsu et al. ......... | 700/229 |
| 6,543,513 B1 | * | 4/2003 | Lau et al. .................... | 414/936 |

* cited by examiner

*Primary Examiner*—G. Bradley Bennett
(74) *Attorney, Agent, or Firm*—Silicon Valley Patent Group LLP (57) ABSTRACT

A compact stage includes a rotary driver and a vertical linear driver that are in the same horizontal plane, which advantageously reduces the height of the device. The stage may include a rotating shaft to which a chuck is mounted. A rotary drive, which may be an annular rotary drive, is coupled to and rotates the rotating shaft. A linear drive is also coupled to the rotating shaft and in one embodiment extends through the center of the annular rotary drive. The linear drive moves the rotating shaft along a vertical axis. The linear drive may be, e.g., a voice coil motor that uses a spring to bias the rotating shaft along the vertical axis.

20 Claims, 7 Drawing Sheets

COMPACT ROTATING STAGE

FIELD OF THE INVENTION

The present invention relates to a stage used to transport and position substrates for measurement and inspection and/or processing, and in particular to a stage that moves rotationally and vertically.

BACKGROUND

Substrates, such as semiconductor wafers or flat panel displays, are typically processed in multiple steps. Many of these steps require the measurement and inspection of surface characteristics. Surface measurement and inspection typically are performed using a stage that moves the substrate so that the entire surface of the substrate can be measured or inspected. In addition, some process steps may be performed on a stage.

One type of stage moves in the Cartesian coordinate system, i.e., in the X and Y directions, and are commonly referred to as XY stages. An XY stage can move a substrate in two independent orthogonal directions, X and Y, to select an area on a substrate for viewing, imaging, measurement or processing.

Another type of stage used in the measuring of substrates is a polar coordinate stage, sometimes referred to as an R-θ stage. R-θ stages move a substrate in a single linear direction (R-motion) and also rotate the stage (θ-motion). By moving the substrate in the R direction and rotating the substrate, any area on the substrate surface may be appropriately positioned for viewing, imaging, measuring or processing.

Both types of stages, Cartesian and polar, sometimes include movement in the vertical direction, referred to as the Z direction.

Stages conventionally include separate actuators or motors for each independent direction of motion. The actuators are generally stacked directly or indirectly, over each other. Thus, for example, a conventional polar coordinate stage will place the θ motor on top of the Z motor.

Often it is desirable for stages to be as compact as possible, in both the footprint and the height. Limiting the height of a stage is particularly important when the stage is to be located in a chamber, such as a processing chamber. While polar coordinate stages are superior to XY stages in terms of footprint, the height of conventional polar coordinate stages is generally large, due to the above-described stacking of the actuators.

Thus, what is needed is an improved rotational stage that also moves vertically and has a vertically compact design.

SUMMARY

A compact stage, in accordance with the present invention, includes a rotary driver and a vertical linear driver that are in the same horizontal plane, which advantageously reduces the height of the device.

In one embodiment, a stage in accordance with an embodiment of the present invention includes a rotating shaft to which a chuck may be mounted. An annular rotary drive is coupled to and rotates the rotating shaft. A linear drive is also coupled to the rotating shaft and extends through the center of the annular rotary drive. The linear drive moves the rotating shaft along a vertical axis.

The stage, in accordance with the above embodiment, may include a base that moves in a linear horizontal direction. A platform is movably coupled to the base, e.g., through linear bearings, and moves along a vertical axis with respect to the base. The annular rotary drive is coupled to one side of the platform, e.g., at an outer portion of the platform, and the linear drive is coupled to opposing side of the platform, e.g., at an inner portion. The inner portion of the platform may extend through the center of the annular rotary drive. A rotary bearing may be used to couple the platform to the rotating shaft.

In addition, the stage may include a spring that provides a bias on the rotating shaft along the vertical axis. The linear drive may be a voice coil motor that can provide a force to overcome the spring bias to move the rotating shaft along the vertical axis.

In another embodiment of the present invention, a stage includes a rotating shaft to which a chuck is mounted and a means for rotating the rotating shaft. A means for driving the rotating shaft along a vertical axis is also included, where the means for driving the rotating shaft is on the same horizontal plane as the means for rotating the rotating shaft. In one embodiment, the means for driving the rotating shaft extends through the means for rotating the rotating shaft.

In one embodiment, the means for rotating the rotating shaft is an annular rotary driver. The means for driving the rotating shaft may be a voice coil motor and in one embodiment includes a spring to bias the rotating shaft along the vertical axis.

In yet another embodiment of the present invention, a method of moving a stage includes driving a shaft along a vertical axis and rotating the shaft about the driver that drives the shaft along said vertical axis, such that the shaft and the driver are on the same horizontal plane.

The method may further include driving the shaft and the driver along the vertical axis in a horizontal direction. Further, the method may include biasing the shaft along the vertical axis, wherein driving the shaft along the vertical axis comprises applying a force to overcome the bias.

DETAILED DESCRIPTION

Figure 1:
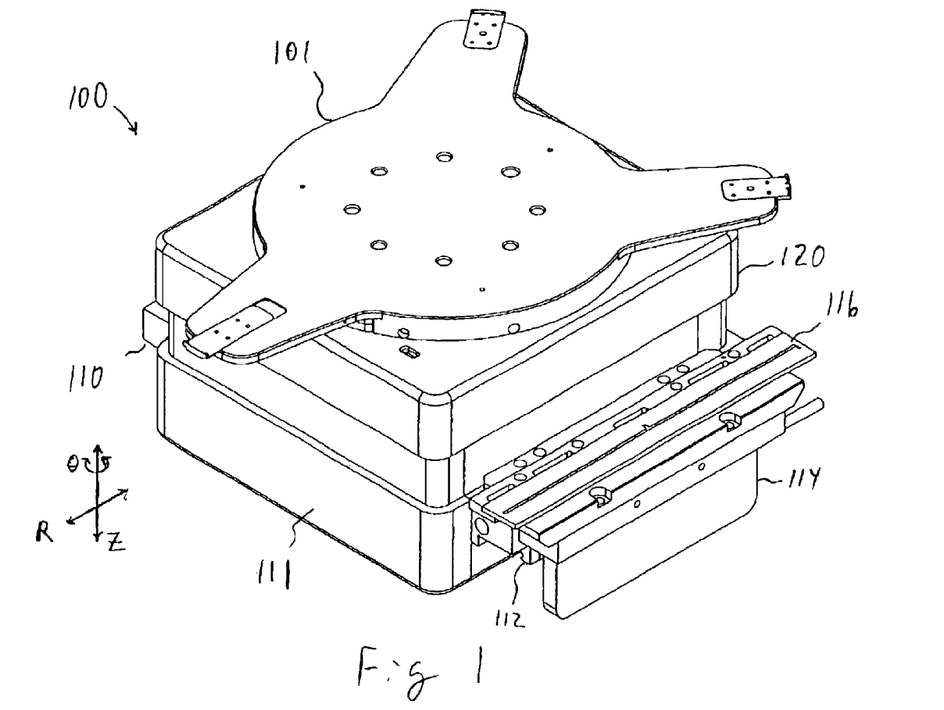
FIGS. 1 and 2 show perspective views of a compact stage, in accordance with an embodiment of the present invention.
Figure 2:
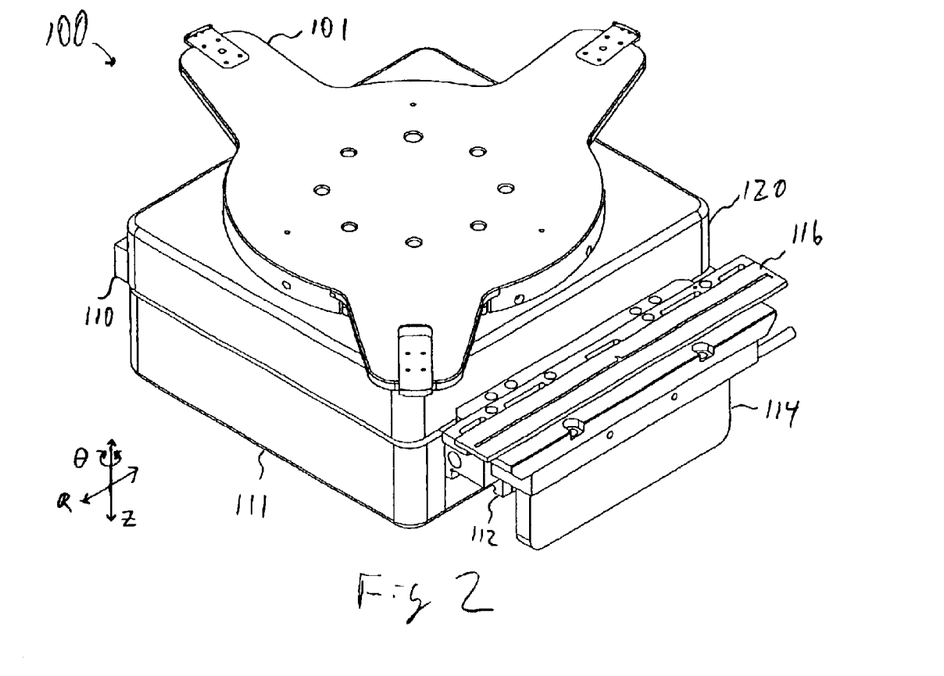

FIGS. 1 and 2 show perspective views of a compact stage 100, in accordance with an embodiment of the present invention. Stage 100 is capable of linear movement horizontally in the R direction and vertically in the Z direction. Stage 100 is also capable of rotating a chuck 101 in the θ direction. Accordingly, stage 100 is sometimes referred to as an R-θ-Z stage.

As shown in FIGS. 1 and 2, stage 100 includes a base 110, which is mostly hidden from view in FIGS. 1 and 2 by a cover 111. The base 110 includes R guides 112 and is coupled to a linear motor 114. Base 110 is moved horizontally in the R direction by linear motor 114 along R guides 112. It should be understood that stage 100 is coupled to a platform (not shown) with rails that mate with the R guides 112 and the mating portion for the linear motor 114. In addition, an R encoder 116 is coupled to the base 110 to detect the relative position of the base 110 with respect to the platform. The R encoder 116 may be used in a feedback or feed forward control system, which is well known in the art.

Stage 100 also includes a Z portion 120, which moves in a linear vertical direction, i.e., along the vertical Z axis. FIGS. 1 and 2 show the Z portion 120 in raised and lowered positions, respectively. Within the Z portion 120 is a linear drive for moving the Z portion 120 in the Z direction, as will be described in more detail below.

Also within Z portion 120 is a rotatory drive for rotating a shaft within the Z portion 120. The shaft is coupled to chuck 101. By rotating the shaft within the Z portion 120, the chuck 101 is rotated in the θ direction, as illustrated in FIGS. 1 and 2.

FIGS. 1 and 2 show an edge grip chuck 101 mounted on stage 100. It should be understood, however, that stage 100 is not limited to use with an edge grip chuck, but may be used with any desired chuck.

Figure 3:
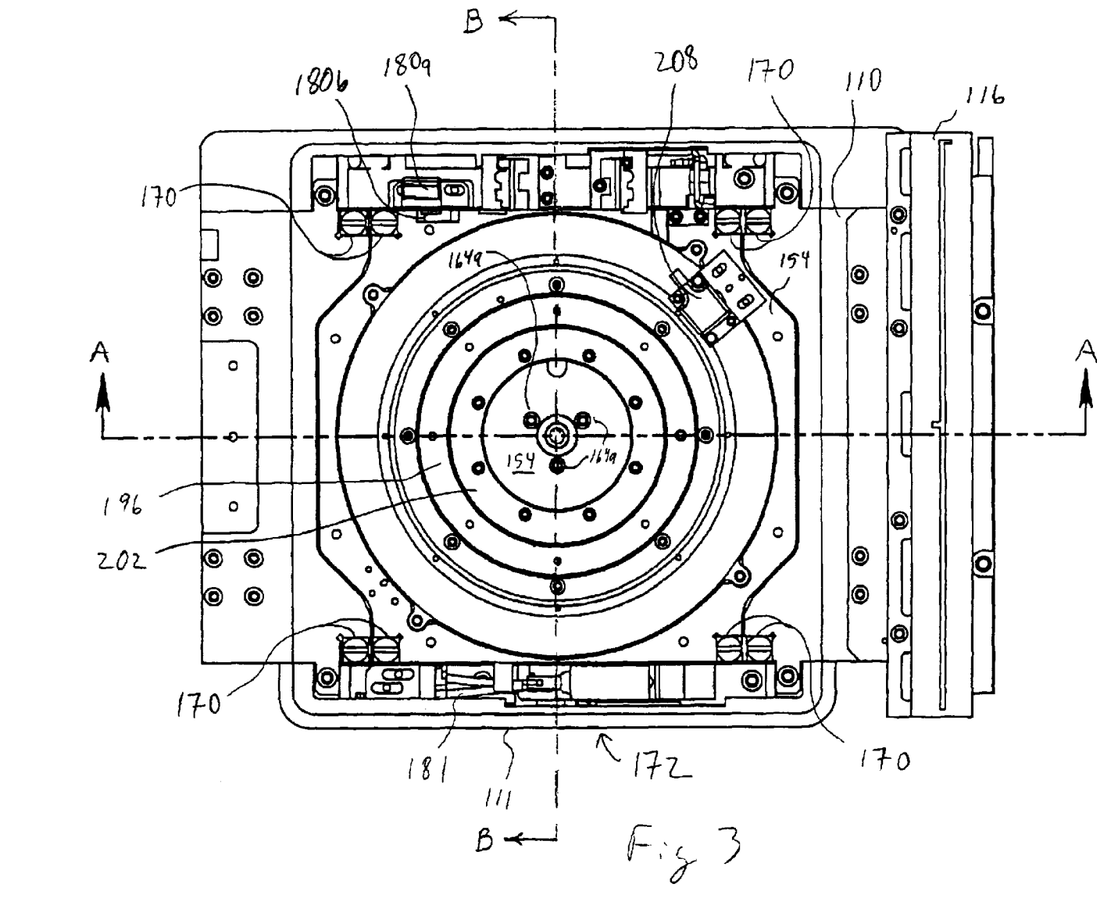
FIG. 3 shows a top view of one embodiment of a stage in accordance with the present invention.
Figure 4A:
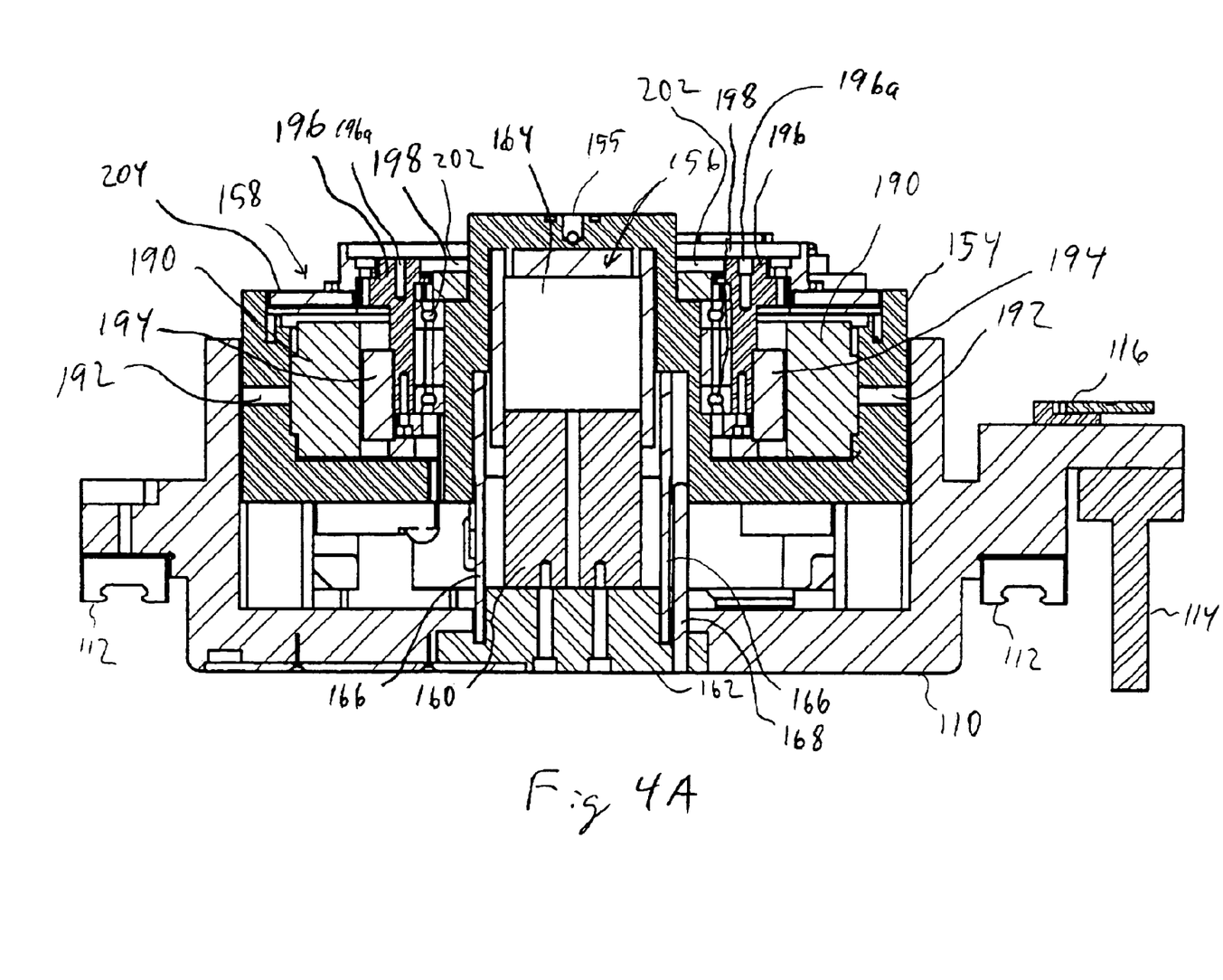
FIGS. 4A and 4B show cross-sectional views of the stage of FIG. 3 along lines AA.
Figure 4B:
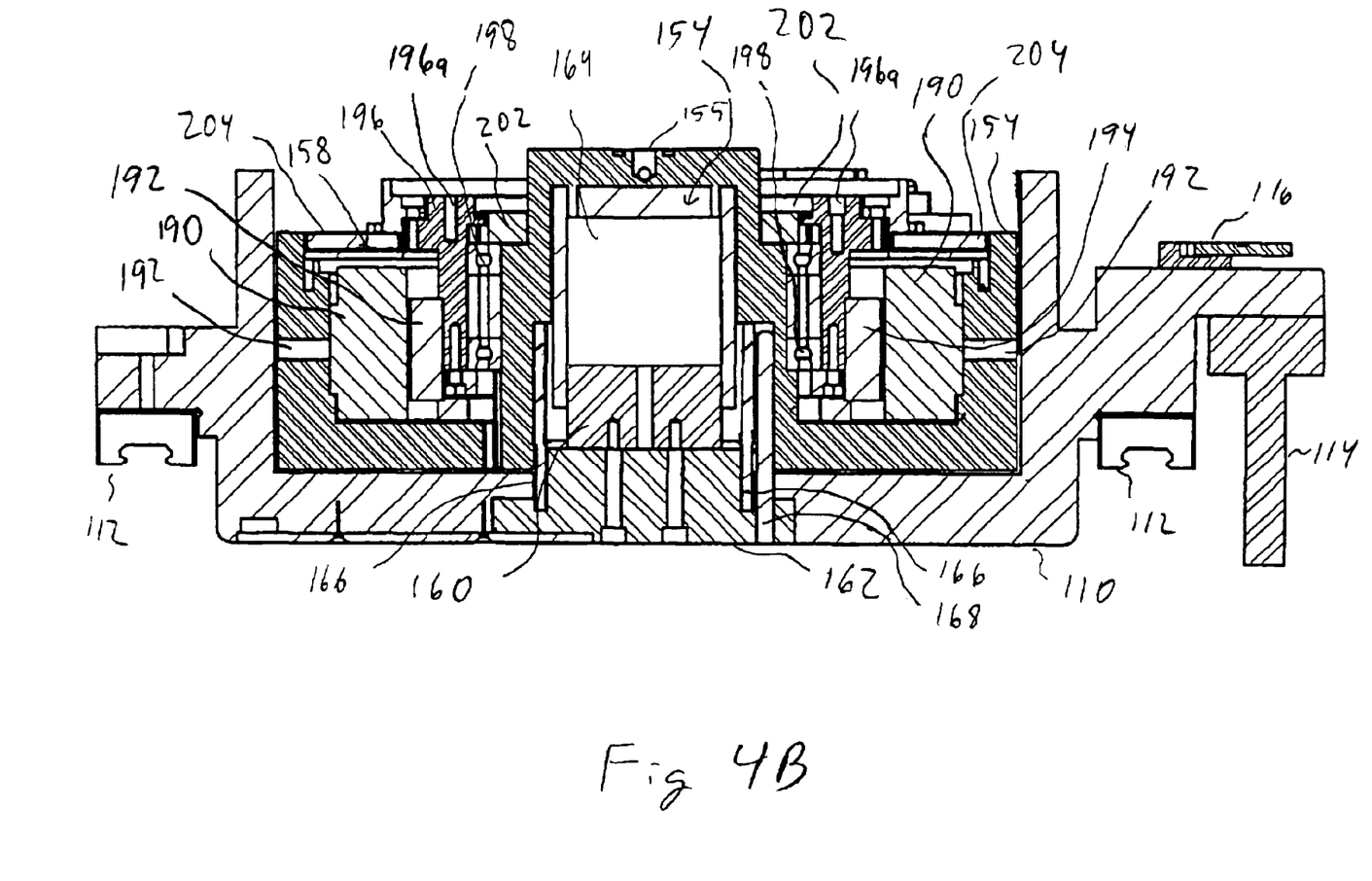
Figure 5:
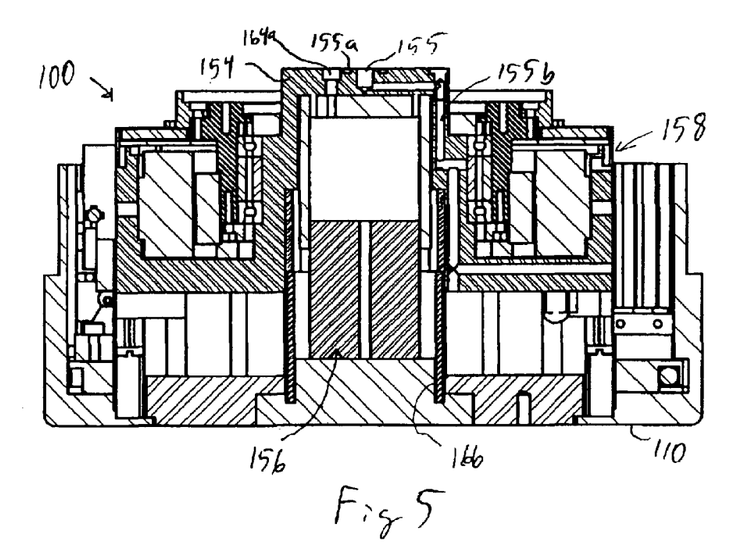
FIG. 5 shows a cross-sectional view of the stage of FIG. 3 along lines BB.

FIG. 3 shows a top view of stage 100 and FIGS. 4A and 4B show cross-sectional views of stage 100 along lines AA in FIG. 3. FIG. 5 shows a cross-sectional view of stage 100 along lines BB in FIG. 3. As shown in FIG. 4A, stage 100 includes the base 110, which moves in the R direction, as indicated in FIGS. 1 and 2, and thus is sometimes referred to as R block 110. Stage also includes a Z platform 154 that serves as part of the Z portion 120 (shown in FIGS. 1 and 2). The Z platform 154 moves vertically relative to the R block 110. FIGS. 4A and 4B show the Z platform 154 in raised and lowered positions, respectively. The R block 110 and Z platform 154 may be manufactured from a material, such as aluminum or an aluminum alloy, e.g., aluminum alloy type 7075 that is annealed prior to the last machining operation.

Figure 6:
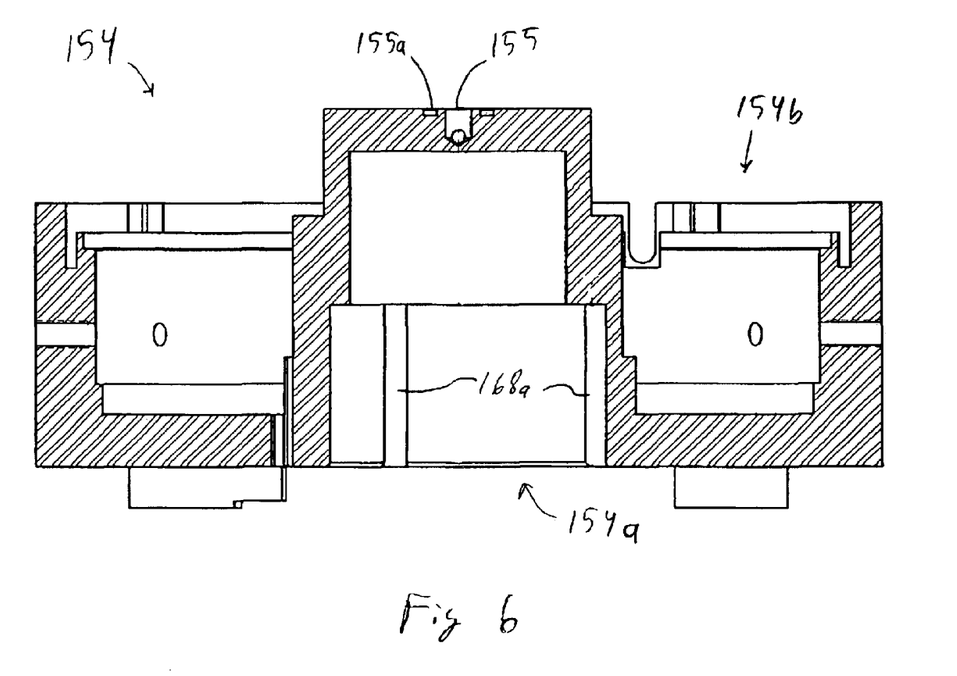
FIG. 6 shows a cross-sectional view of the Z platform along lines AA in FIG. 3.

FIG. 6 shows a cross-sectional view of the Z platform 154 along lines AA in FIG. 3. The Z platform 154 includes a cylindrical inner portion 154a and a cylindrical outer portion 154b. The Z platform 154 is raised at the inner portion 154a, which provides an inset under the Z platform 154. A linear drive, sometimes referred to herein as Z drive 156, is mounted in the inset inner portion 154, as illustrated in FIGS. 4A and 4B. An annular rotary driver, sometimes referred to herein as rotary drive 158, is mounted in the outer portion 154b of the Z platform 154, as illustrated in FIGS. 4A and 4B. The annular rotary drive 158 is, e.g., a brushless motor. As can be seen in FIGS. 4A and 4B, the linear drive extends through the center of the annular rotary drive.

Z platform 154 also includes an aperture 155 through which a vacuum or gas may be provided to a chuck 101. The path 155b through Z platform 154 to aperture 155 can be seen in FIG. 5. A sealing bearing is placed in a sealing ring 155a to provide a seal between chuck 101 and the Z platform 154. A small amount of lubricant may be placed on the chuck 101 in order to reduce friction with the sealing ring 155a.

The Z platform 154 is driven in the vertical direction using the Z drive 156, which in one embodiment is a voice coil motor. As shown in FIGS. 4A and 4B, Z drive 156 may include a coil 160 that is mounted to a cap 162, e.g., by bolts or other appropriate mounting mechanism, and the cap 162 is mounted to the R block 110, e.g., by bolts or other appropriate mounting mechanism. A magnet 164 is mounted to the Z platform 154, e.g., by bolts 164a shown in FIGS. 3 and 5, or other appropriate mounting mechanism, in the inner portion 154a of Z platform 154. A spring 166 surrounds coil 160 and is disposed between the Z platform 154 and the cap 162. The spring 166 provides an upward bias on the Z platform 154. By controlling the force produced by the Z drive 156, Z platform 154 may be raised and lowered, e.g., the bias of the spring 166 can be used to lower the Z platform 154 by overcoming the bias of the spring 166. The operation of a voice coil motor is well known.

Figure 7A:
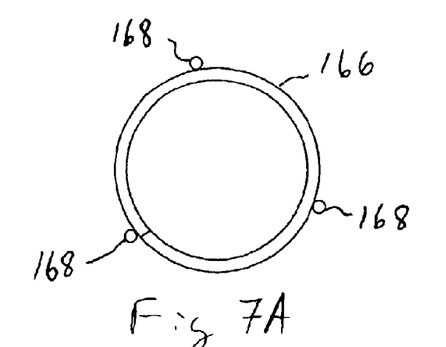
FIGS. 7A and 7B show a top view and side view, respectively of the biasing spring with reinforcing members.
Figure 7B:
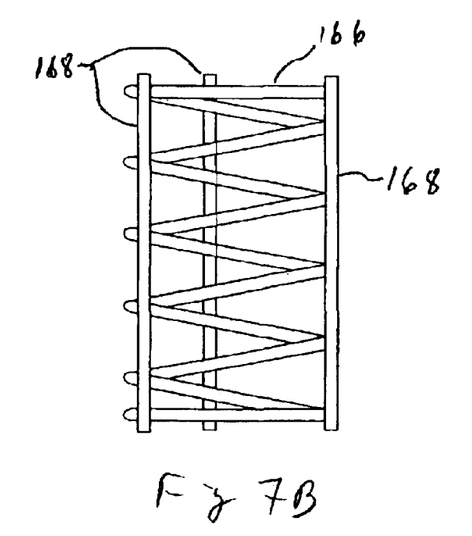

Reinforcing members 168 extend through cap 162 and are used to prevent the spring 166 from buckling. Only one reinforcing member 168 is shown in FIGS. 4A and 4B. FIGS. 7A and 7B show a top view and side view, respectively of the spring 166 with reinforcing members 168. As can be seen in FIGS. 4A, 4B, and 5, Z platform 154 includes grooves 168a to accommodate reinforcing members 166.

Figure 8:
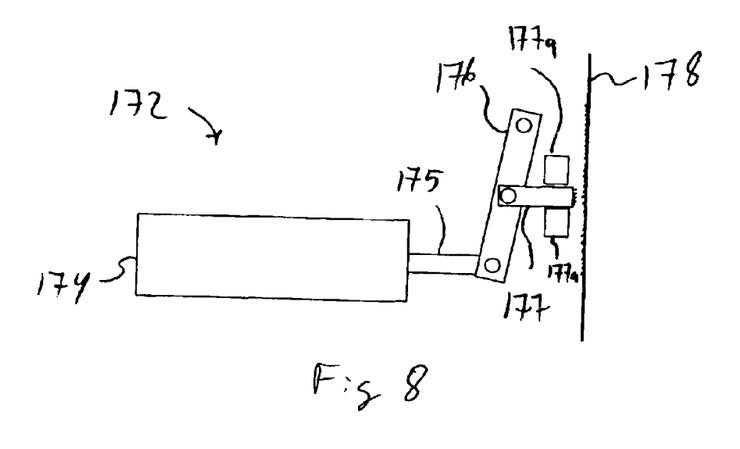
FIG. 8 shows a side view of one embodiment of a brake assembly.

Disposed between the R block 110 and Z platform 154 are linear bearings 170 (shown in FIG. 3), which permit vertical movement of Z platform 154 with respect to the R block 110. Four sets of linear bearings 170, i.e., at each corner of Z platform 154, are shown, but some other number of linear bearings 170 may be used if desired. In addition, a brake assembly 172 is mounted to R block 110. The brake assembly 172 switchably locks against the Z platform 154 to hold the Z platform 154 at a vertical position, e.g., during an emergency stop. FIG. 8 shows a side view of one embodiment of the brake assembly 172, which includes an actuator 174, such as a bistable solenoid, and an arm 175, which is pivotably connected to a lever arm 176. The lever arm 176 is rotatably coupled to the R block 110 at the opposite end. A stop arm 177 is rotatably coupled to the lever arm 176. Guides 177a and 177b are on either side of stop arm 177 and guide the stop arm 177 to move horizontally when arm 175 moves. The end of the stop arm 177 is grooved. A tang 178 on the Z platform 154 is also grooved so that when the stop arm 177 is pressed against the tang 178, the grooves mesh to prevent any further motion of the Z platform 154.

A linear encoder, shown in FIG. 3, is used to detect the vertical position of the Z platform 154, e.g., where the scale 180a is located on the Z platform 154 and the reader 180b is located on the base 110. The encoder 180 may be used in a well known feedback or feed forward control system to control the position and movement of Z platform 154. The linear encoder 180 may also be used to determine the vertical position of the Z platform 154 on start up. Alternatively, a secondary encoder 181 may be used to determine the vertical position on start up. The secondary encoder 181, e.g., uses an LED coupled to the Z platform 154 and a photodiode coupled to the base 110 and determines approximate distance between the LED and photodiode based on the intensity of the light received by the photodiode.

Referring back to FIGS. 4A and 4B, the rotary drive 158 is mounted in the cylindrical outer portion 154b of the Z platform 154. Rotary drive 158 includes a stator 190 and a rotor 194. The stator 190 is mounted to the Z platform 154, e.g., using bolts 192, or other appropriate mounting mechanism. The rotor 194 is mounted to a rotating shaft 196, which is rotatably coupled to the Z platform 154 through bearings 198. Thus, the Z drive 156 is coupled to the rotating shaft 196 through the Z platform 154 and rotary bearings 198.

The chuck 101 mounts to the rotating shaft 196, e.g., via bolts 196a. A clamp 202 is mounted on Z platform 154 and the bearing 198 and places a preload on the bearing 198. A θ encoder glass 204 is mounted to the rotating shaft 196 by means of θ glass hub 206. It is desirable to have a large diameter encoder glass 204. The reader 208 for the θ encoder glass 204 is shown in FIG. 3. The rotary encoder may be used in a feedback or feed forward loop to control the rotational movement and positioning of the rotating shaft 196, and thus, the chuck 101. The operation of a rotary actuator and a rotary encoder is well known.

Thus, as can be seen, the stage 100 in accordance with the present invention has a compact configuration with the rotary drive 158 encircling the Z drive 156. In other words, the rotary drive 158 and the Z drive 156 are in approximately the same horizontal plane. Accordingly, the vertical height of the stage 100 is substantially reduced compared to conventional stages.

Figure 9:
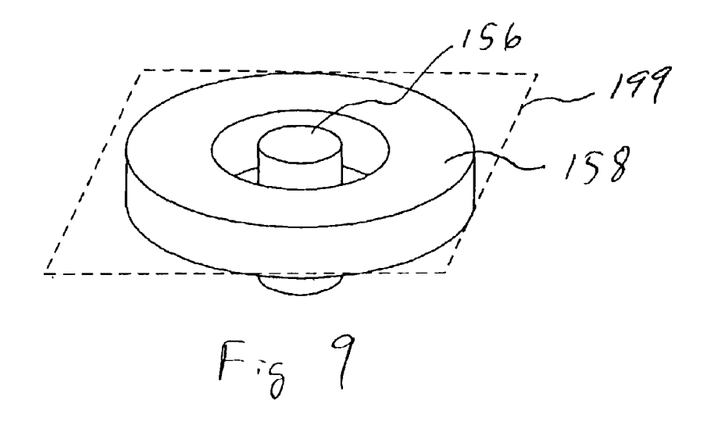
FIGS. 9 and 10 show perspective and front schematic views of the orientation of the rotary drive and the Z drive.
Figure 10:
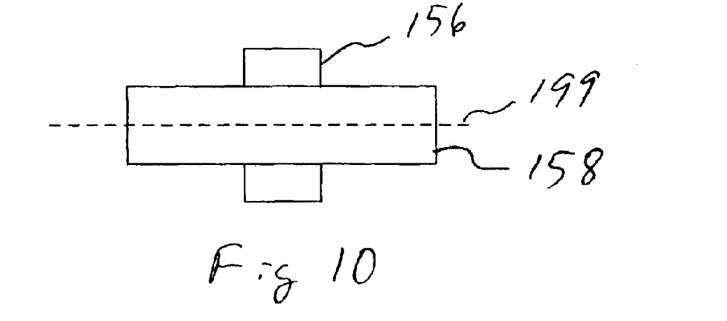

FIGS. 9 and 10 show perspective and front schematic views of the orientation of the rotary drive 158 and the Z drive 156. The Z platform 154, bearings 198, and rotating shaft 196, which are disposed between the rotary drive 158 and the Z drive 156 are not shown in FIGS. 9 and 10. As can be seen, the rotary drive 158 and the Z drive 156 fie within the same plane, indicated by dotted lines 199. Because the rotary drive 158 and the Z drive 156 lie within the same plane, the height of the stage is advantageously minimized.

Figure 11:
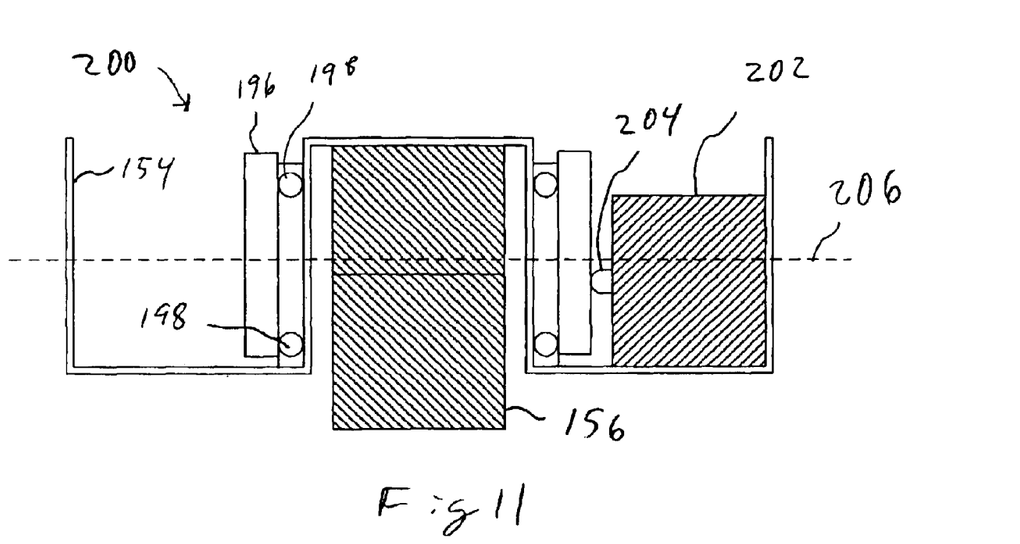
FIG. 11 illustrates a cross-sectional view another embodiment of a compact stage.

It should be understood that the components used with stage 100 may be varied from what is described herein. For example, the Z drive 156 may be an actuator other than a voice coil motor, such as a lead screw coupled to another rotary motor, or a linear bearing. The rotary drive 158 may be a brushless "pancake" type motor, or other rotary actuator. FIG. 11, by way of example, illustrates a cross-sectional view a stage 300 that is similar to stage 100, like designated elements being the same. FIG. 11 shows a Z drive 156 coupled to the Z platform, 154, and the Z platform 154, bearings 198, and rotating shaft 196 disposed between the rotary drive 302 and the Z platform 154. The rotary drive 302 in FIG. 11 drives the rotation of the rotating shaft 196 using a wheel 204. Thus, as can be seen in FIG. 11, the Z drive 156 and the rotary drive 302 are within the same plane 206, but the Z drive 156 does not extend through the center of the rotary drive 302. There may be multiple rotary drives 302 located around the perimeter of the Z platform 154.

In another embodiment, the locations of the rotary drive and the Z drive may be switched so that the rotary drive rotates the Z stage 154 and Z drive, as opposed to the Z drive lifting the rotary drive.

The particular components, e.g., motors, bearings, encoders, etc. to be used are determined, e.g., based on the dimensions and accuracy of the desired stage, and selecting such components is well within the abilities of those skilled in the art in light of the present disclosure.

Although the present invention is illustrated in connection with specific embodiments for instructional purposes, the present invention is not limited thereto. Various adaptations and modifications may be made without departing from the scope of the invention. For example, various embodiments may be combined to practice the present invention. Therefore, the spirit and scope of the appended claims should not be limited to the foregoing description.

What is claimed is:

1. A stage comprising:

a rotating shaft to which a chuck is mounted;

an annular rotary drive coupled to said rotating shaft, said rotary drive rotates said rotating shaft; and a linear drive coupled to said rotating shaft, said linear drive moves said rotating shaft along a vertical axis, said linear drive extending through the center of said annular rotary drive.

2. The stage of claim 1, further comprising:

a base that moves in a linear horizontal direction; and a platform moveably coupled to said base, said platform moving in a linear vertical direction with respect to said base, said rotating shaft rotatably coupled to said platform, said platform having a first side and a second side opposing said first side, wherein said annular rotary drive is coupled to said first side and said linear drive is coupled to said second side.

3. The stage of claim 2, wherein said first side is the top side of said platform and said second side is the bottom side of said platform.

4. The stage of claim 2, said platform has an inner section and an outer section, wherein said annular rotary drive is coupled to said outer section and wherein said inner section extends through the center of said annular rotary drive.

5. The stage of claim 2, further comprising a rotary bearing disposed between said platform and said rotating shaft; wherein said linear drive is coupled to said rotating shaft through said platform and said rotary bearing.

6. The stage of claim 2, further comprising a linear bearing disposed between said base and said platform.

7. The stage of claim 1, wherein said linear drive is a voice coil motor.

8. The stage of claim 7, further comprising a spring coupled to said rotating shaft, wherein said spring biases said rotating shaft along said vertical axis, wherein said voice coil motor drives said rotating shaft along said vertical axis by overcoming said bias.

9. The stage of claim 8, wherein said spring is coupled to said annular rotary drive and extends through the center of said annular rotary drive, said spring biases said annular rotary drive along said vertical axis.

10. The stage of claim 1, wherein said linear drive coupled to said rotating shaft is a first linear drive, said stage further comprising:

further comprising a second linear drive that is coupled to said rotating shaft, said annular rotary drive, and said first linear drive, said second linear drive moves said rotating shaft, said annular rotary drive, and said first linear drive in a horizontal direction.

11. A stage comprising:

a rotating shaft to which a chuck is mounted;

a means for rotating said rotating shaft; and a means for driving said rotating shaft along a vertical axis, said means for driving said rotating shaft is on the same horizontal plane as said means for rotating said rotating shaft.

12. The stage of claim 11, wherein said means for driving said rotating shaft along a vertical axis extends through the center of said means for rotating said rotating shaft.

13. The stage of claim 11, wherein said means for rotating said rotating shaft comprises an annular rotary driver coupled to said rotating shaft.

14. The polar coordinate of claim 13, wherein said annular rotary driver comprises a stator and a rotor, one of which is mounted to said rotating shaft and the other of which is coupled to said means for driving said rotating shaft along a vertical axis.

15. The polar coordinate of stage of claim 11, wherein said means for driving said rotating shaft along a vertical axis comprises a voice coil motor coupled to said means for rotating said rotating shaft.

16. The stage of claim 15, wherein said voice coil motor comprises a magnet and a coil one of which is mounted to a platform, said platform is coupled to said means for rotating and is rotatably coupled to said rotating shaft, said platform extends through the center of said means for rotating said rotating shaft.

17. The stage of claim 16, wherein said means for driving said rotating shaft further comprises a spring for biasing said rotating shaft along a vertical axis.

18. A method of moving a stage, said method comprising:
driving a shaft along a vertical axis; and
rotating said shaft about the driver that drives said shaft along said vertical axis, such that said shaft and driver are on the same horizontal plane.

19. The method of claim 18, further comprising driving said shaft and said driver that drives said shaft along said vertical axis in a horizontal direction.

20. The method of claim 18, further comprising, biasing said shaft along said vertical axis and wherein driving said shaft along said vertical axis comprises applying a force to overcome said bias.

* * * * *